(12) United States Patent
Franklin

(10) Patent No.: US 7,051,126 B1
(45) Date of Patent: May 23, 2006

(54) HARDWARE ACCELERATED COMPRESSION

(75) Inventor: Jason G. Franklin, Veradale, WA (US)

(73) Assignee: F5 Networks, Inc., Seattle, WA (US)

( * ) Notice: Subject to any disclaimer, the term of this patent is extended or adjusted under 35 U.S.C. 154(b) by 337 days.

(21) Appl. No.: 10/643,459

(22) Filed: Aug. 19, 2003

(51) Int. Cl.
*G06F 13/12* (2006.01)

(52) U.S. Cl. ............................ 710/68; 710/65; 710/66; 709/247

(58) Field of Classification Search ................. 710/65, 710/66, 68; 709/247
See application file for complete search history.

(56) References Cited

U.S. PATENT DOCUMENTS

| | | | |
|---|---|---|---|
| 2004/0001207 A1* | 1/2004 | Nishimura ................... | 358/1.2 |
| 2004/0091042 A1* | 5/2004 | Herath ........................ | 375/240 |
| 2004/0190635 A1* | 9/2004 | Ruehle ........................ | 375/253 |
| 2004/0210668 A1* | 10/2004 | Garakani et al. ........... | 709/236 |

OTHER PUBLICATIONS

M.J. Slattery et al., "Design Considerations for the ALDC Cores," *IBM Journal of Research and Development*, Oct. 23, 1998 (5 pages).

David Mertz, "A Data Compression Primer, Theory and Strategy of Data Representation," *IBM developerWorks*, May 1, 2001 (6 pages).
Nam Phamdo, "Lossless Data Compression," *Data-Compression.com*, 2000-2001 (5 pages).
"LZ77 Compression," *FOLDOC*, Apr. 7, 1995 (2 pages).

* cited by examiner

*Primary Examiner*—Fritz Fleming
*Assistant Examiner*—Niketa Patel
(74) *Attorney, Agent, or Firm*—Brett A. Hertzberg; Merchant & Gould PC

(57) ABSTRACT

A compression system is arranged to use software and/or hardware accelerated compression techniques to increase compression speeds and enhance overall data throughput. A logic circuit is arranged to: receive a data stream from a flow control processor, buffer the data stream, select a hardware compressor (e.g., an ASIC), and forward the data to the selected hardware compressor. Each hardware compressor performs compression on the data (e.g., LZ77), and sends the compressed data back to the logic circuit. The logic circuit receives the compressed data, converts the data to another compressed format (e.g., GZIP), and forwards the converted and compressed data back to the flow control processor. History associated with the data stream can be stored in memory by the flow control processor, or in the logic circuit.

38 Claims, 4 Drawing Sheets

HARDWARE ACCELERATED COMPRESSION

FIELD OF THE INVENTION

The present invention is related to HTTP compression. More particularly, the present invention is related to a compression system that utilizes software and/or hardware accelerated compression techniques to increase compression speeds and overall data throughput.

BACKGROUND OF THE INVENTION

Data compression is used in a variety of programming contexts to provide increased speeds in data transfers. Typical compression algorithms review the entire data set and attempt to remove redundancy from the data set. Redundancy can take the form of repeated bit sequences, repeated byte sequences, as well as other forms of repeated sequences.

Data compression algorithms can be generally characterized as lossless or lossy. Lossless compression involves the transformation of a data set such that an exact reproduction of the data set can be retrieved by applying a decompression transformation. Lossless compression is most often used to compact data, where an exact replica is required. Lossy compression cannot be used to generate an exact reproduction, but can be used to generate a fair representation of the original data set through decompression. Lossy compression techniques are often used for images, sound-files, and video, where the loss errors are generally imperceptible to human observers.

White-space compression is one type of commonly used lossy compression scheme. An example white-space compression scheme is to remove all of the indentation and vertical spacing in an HTML document that is destined for a web browser. Since the HTML document is destined to a web browser, formatting of the document is handled by the browser and removal of the white spaces has no noticeable effect. After white-space compression, HTML document can be transmitted faster, utilizing less storage space.

Run-length encoding (RLE) is a simple lossless compression technique. The main idea in RLE compression is that many data representations consist largely of strings that repeat. The number of times the string repeats is described by a number, followed by the string itself. For data sets that many repeated characters RLE compression provides acceptable performance.

Huffman encoding is a lossless compression technique that takes a block of input characters of a fixed length and produces a block of output bits of variable length. The basic idea of Huffman coding is to assign short code words to input blocks that have high probabilities and long code words to input blocks that have low probabilities. Huffman coding is accomplished by creating a symbol table for a data set, determining the frequency of the symbol occurrence, and code values to each symbol in the data set based on the frequency. Although the coding process is slower, the decoding process for Huffman coded data is of a similar speed to RLE decompression.

Lempel-Ziv compression (LZ77) is an adaptive dictionary-based lossless compression algorithm. The compression algorithm maintains a list of all substrings that have been found so far in the data stream. At any given point in the input string, the longest substring starting at that point that matches one of the stored strings is located. The repeated substring can thus be replaced by a pointer to the original, saving space. The data structure is a window that slides through the data set.

Hypertext Markup Language (HTML) is used in most Web pages, and forms the framework where the rest of the page appears (e.g., images, objects, etc). Unlike images such as GIF, JPEG, and PNG, which are already compressed, HTML is ASCII text. Since ASCII text is highly compressible, compressing HTML can have a major impact on the data transfer rate for web pages. A compressed HTML page appears to pop onto the screen, especially over slower transfer mediums such as dial-up modems.

Most modern web browsers include a built-in decompression algorithm that is compatible with GZIP. GZIP is a command-line file compression utility distributed under the GNU public license. GZIP is a lossless compressed data format that is available as an open-source variant of the Lempel-Ziv compression. GZIP compression is accomplished by finding duplicate strings in the input data stream. The second occurrence of a string is replaced by a pointer to the previous string, in the form of a pair (distance, length). Distances are limited to 32 K bytes, and lengths are limited to 258 bytes. When a string does not occur anywhere in the previous 32 K bytes, it is emitted as a sequence of literal bytes.

SUMMARY OF THE INVENTION

Briefly stated, an apparatus, system, and method is related to a compression system that is arranged to use software and/or hardware accelerated compression techniques to increase compression speeds and enhance overall data throughput. A logic circuit is arranged to: receive a data stream from a flow control processor, buffer the data stream, select a compression ASIC, and forward the data to the selected ASIC. Each ASIC performs compression on the data (e.g., LZ77), and sends the compressed data back to the logic circuit. The logic circuit receives the compressed data, converts the data to another compressed format (e.g., GZIP), and forwards the converted and compressed data back to the flow control processor. History associated with the data stream can be stored in memory by the flow control processor, or in the logic circuit.

According to one aspect of the present invention an apparatus is related to compressing data from a data stream. The apparatus includes a hardware compressor and a logic block. The hardware compressor is arranged to provide compressed data in response to buffered data, wherein the compressed data is encoded according to a first compression format with a first history window size. The logic block is arranged to: receive data associated with the data stream, store the data as the buffered data, forward the buffered data to the hardware compressor, receive the compressed data from the hardware compressor, convert the compressed data to a second compression format with a second byte window size that is different from the first history window size, and provide the converted compressed data.

According to another aspect of the present invention, a method is related to compressing data associated with a data stream. The method includes receiving data from a flow controller with a logic block, storing the received data as buffered data, and selecting a hardware compressor for processing the buffered data. The buffered data is sent from the logic block to the selected hardware compressor. The hardware compressor compresses the buffered data according to a first compression format, where the first compression format has a first history window size. The compressed data is retrieved from the selected hardware compressor with the logic block. The compressed data is converted to a second compression format with the logic block. The second compression format has a second history window size that is different from the first history window size. The logic block assembles a header that associates the converted compressed data with the data from the flow controller. The header and the converted compressed data is sent to the flow controller.

According to still another aspect of the present invention, a system is related to compressing data associated with a data stream. The system includes a first hardware compressor, a second hardware compressor, a flow controller, and a logic block. The first hardware compressor is arranged to compress data according to a first compression format. The second hardware compressor is arranged to compress data according to the first compression format. The logic block includes: a first means for receiving, a means for storing, a means for selecting, a first means for sending, a second means for receiving, a means for converting, and a second means for sending. The first means for receiving is arranged to receive data from the flow controller. The means for storing is arranged to store the received data as buffered data. The means for selecting is arranged to select one of the first and second hardware compressors for processing the buffered data. The first means for sending is arranged to send buffered data to the selected hardware compressor. The second means for receiving is arranged to receive compressed data from the selected hardware compressor, where the compressed data is arranged according to a first compression format. The means for converting is arranged to convert the compressed data to a second compression format that is different from the first compression format. The second means for sending is arranged to send converted compressed data to the flow controller such that the converted compressed data is associated with the data received from the flow controller.

According to yet still another aspect of the present invention, a method is related to compressing data associated with a flow. The method includes: receiving the data with a flow controller, evaluating system resources associated with the flow controller, selecting a software based compression method when sufficient system resources are available in the flow controller, selecting a hardware based compression method when insufficient system resources are available in the flow controller, and compressing the data according to the selected compression method.

A more complete appreciation of the present invention and its improvements can be obtained by reference to the accompanying drawings, which are briefly summarized below, to the following detailed description of illustrative embodiments of the invention, and to the appended claims.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
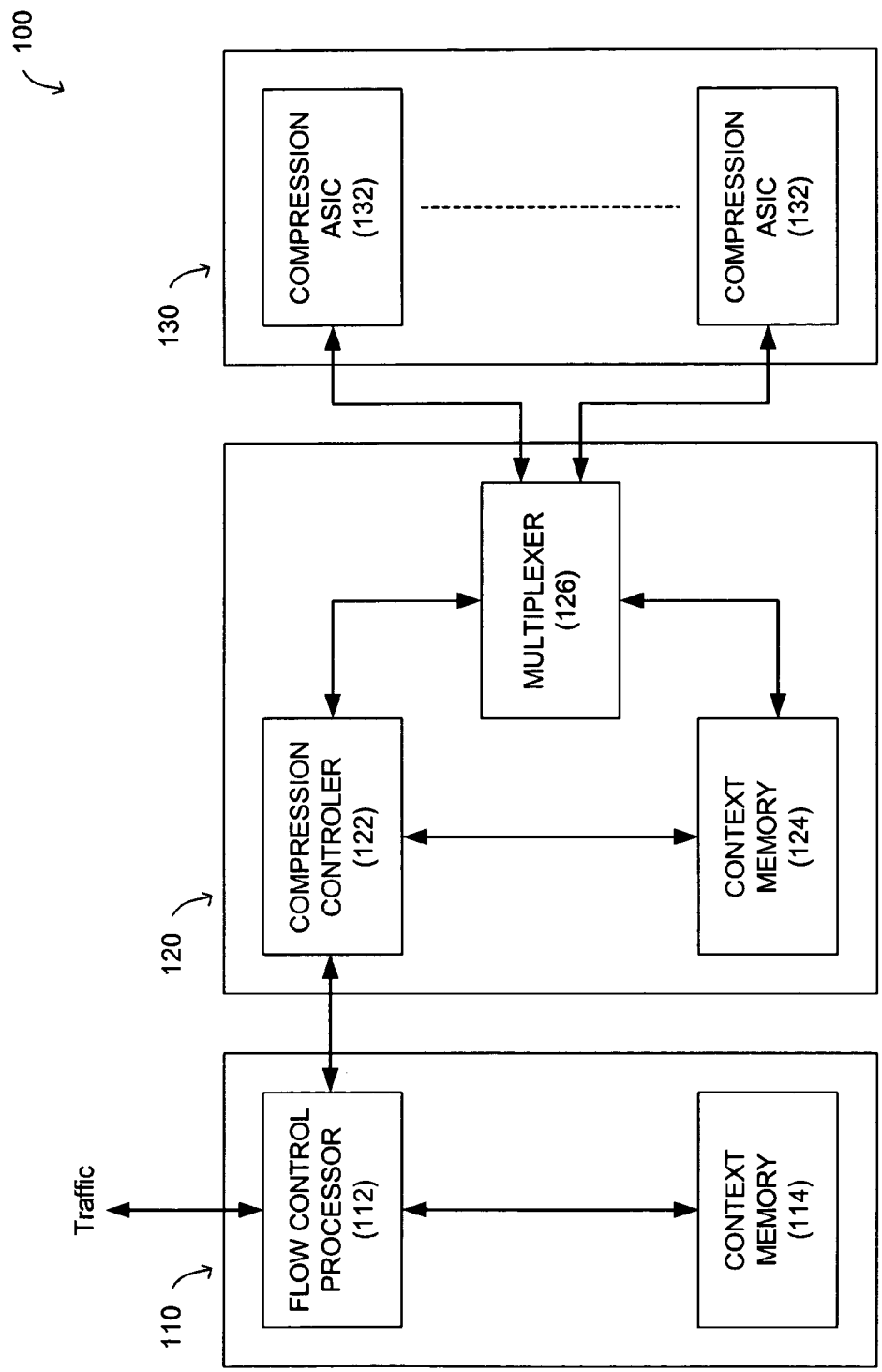
FIG. 1 is an illustration of an example system.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Hardware Compression System Overview

Briefly stated, the present invention is related to a compression system that is arranged to use software and/or hardware accelerated compression techniques to increase compression speeds and enhance overall data throughput. A logic circuit is arranged to: receive a data stream from a flow control processor, buffer the data stream, select a compression ASIC, and forward the data to the selected ASIC. Each ASIC performs compression on the data (e.g., LZ77), and sends the compressed data back to the logic circuit. The logic circuit receives the compressed data, converts the data to another compressed format (e.g., GZIP), and forwards the converted and compressed data back to the flow control processor. History associated with the data stream can be stored in memory by the flow control processor, or in the logic circuit.

Compression algorithms such as GZIP can be used to compress HTML for viewing on web browsers. GZIP requires each data stream to be evaluated to construct a history table of each string that is found in the data stream. A buffer is used to store the data stream for evaluation. For example, the Deflate compression algorithm used by GZIP is an LZ77 compression algorithm that allows the compressor to look back in the previous 32 K bytes of data for a matched string. A combination of software and hardware can be used to reduce the memory requirement by defining a "history" buffer that is less than 32 K bytes in length. However, using a smaller history buffer can reduce compression ratios.

Specially designed ASICs (Application Specific Integrated Circuits) are becoming available to provide high speed compression of data. An example LZ77 hardware compression ASIC includes a history buffer size of up to 4 K bytes in length. Although the hardware compression ASIC offers much better compression data rates than software, the use of a smaller history buffer (e.g., 4 K bytes) results in worse compression ratios due to the small sampling window. The present invention utilizes hardware compression ASICs that have smaller history buffers than GZIP to improve the overall compression speeds, as will be illustrated by the examples found below.

Example System

FIG. 1 is an illustration of an example system (100) that is arranged in accordance with an aspect of the present invention. System 100 includes a flow controller (110), a logic block (120), and a hardware compressor (130). Flow controller 110 includes a flow control processor (112) and An optional context memory (114). Logic block 120 includes a compression controller (122), a memory (124), and a multiplexer (126). Logic block 130 includes a plurality of compression ASICs (132). System 100 can be configured in various arrangements where compression is performed in software (SW) when system resources are available and otherwise in hardware (HW), and where all compression is performed in HW.

The interface between flow controller 110 and logic block 120 can be an Ethernet based connection (including 10 Mbit, 100 Mbit, 1 Gbit, etc.), a PCI bus (an example PCI 64/66 bus has a maximum rate of 2.0 Gbit/sec), or any other appropriate interface bus. Logic block 120 may be implemented as a system board, a custom IC (i.e., an ASIC), or a programmable logic device (PLD) such as a gate array a field programmable gate array (FPGA). Each compression ASIC (132) can operate on a different data set such that multiple data streams are compressed in parallel. In one example, each compression ASIC is capable of continuously compressing data at a rate of approximately 640 Mbit/s. When three compression ASICs are arranged in parallel operation, an effective compression rate of 1.8 Gbit/s is achievable. The number of compression ASICs is scalable to provide a desired throughput rate.

Flow control processor 112 can be configured to provide software based compression. In one example, SW compression is provided to maximize the compression ratio of traffic. In another example, SW compression is provided when the flow control processor is operating with a light load. For example, by monitoring how busy the flow control processor is, a smart decision can be made on when to make the trade-off between compression data rate and compression ratio. By monitoring the memory usage, a smart decision can be made on how big a history buffer to use for software compression. Additionally, the system switches to hardware based compression when the history buffer size used by software approaches that of the hardware.

As described above, SW based compression may be provided by flow control processor 112. SW compression can be described as the application of a procedure to algorithmically compress data. The algorithm or procedural steps can be stored in a volatile or non-volatile storage, and executed by flow control processor 112. Volatile storage includes memory devices such as random access memory (RAM). Non-volatile storage includes non-volatile memories and non-volatile storage mediums. Example non-volatile memories include read-only memory (ROM), programmable read only memory (PROM), erasable programmable read-only memory (EPROM), electrically erasable read only memory (EEPROM), and flash-type memories. Non-volatile storage mediums include: magnetic, electrical, and optical storage mediums. Magnetic storage mediums include: hard disks, floppy disks, ZIP disks, cassette-type tapes, reel-to-reel tapes, and magneto-optical disks (MO), to name a few. Electrical storage mediums include flash-type memories. Optical Storage mediums include compact discs (CDs), digital versatile discs (DVDs), as well as others. Software that is loaded by a processor from a non-volatile memory is often referred to as firmware.

HW based compression is provided by a system, circuit, and/or microchip that is specially designed to algorithmically compress data. An example HW based compression system includes an ASIC, a programmable logic device (PLD), a field programmable logic device (FPLD), a gate array, and/or a field programmable gate array (FPGA) that is specially designed to provide compression. The HW based compression system may also include a processor that is software controlled, where the processor is arranged to coordinate the transfer of compressed and uncompressed data between the flow controller and the HW compression device or devices.

Example Process Flow

Figure 2:
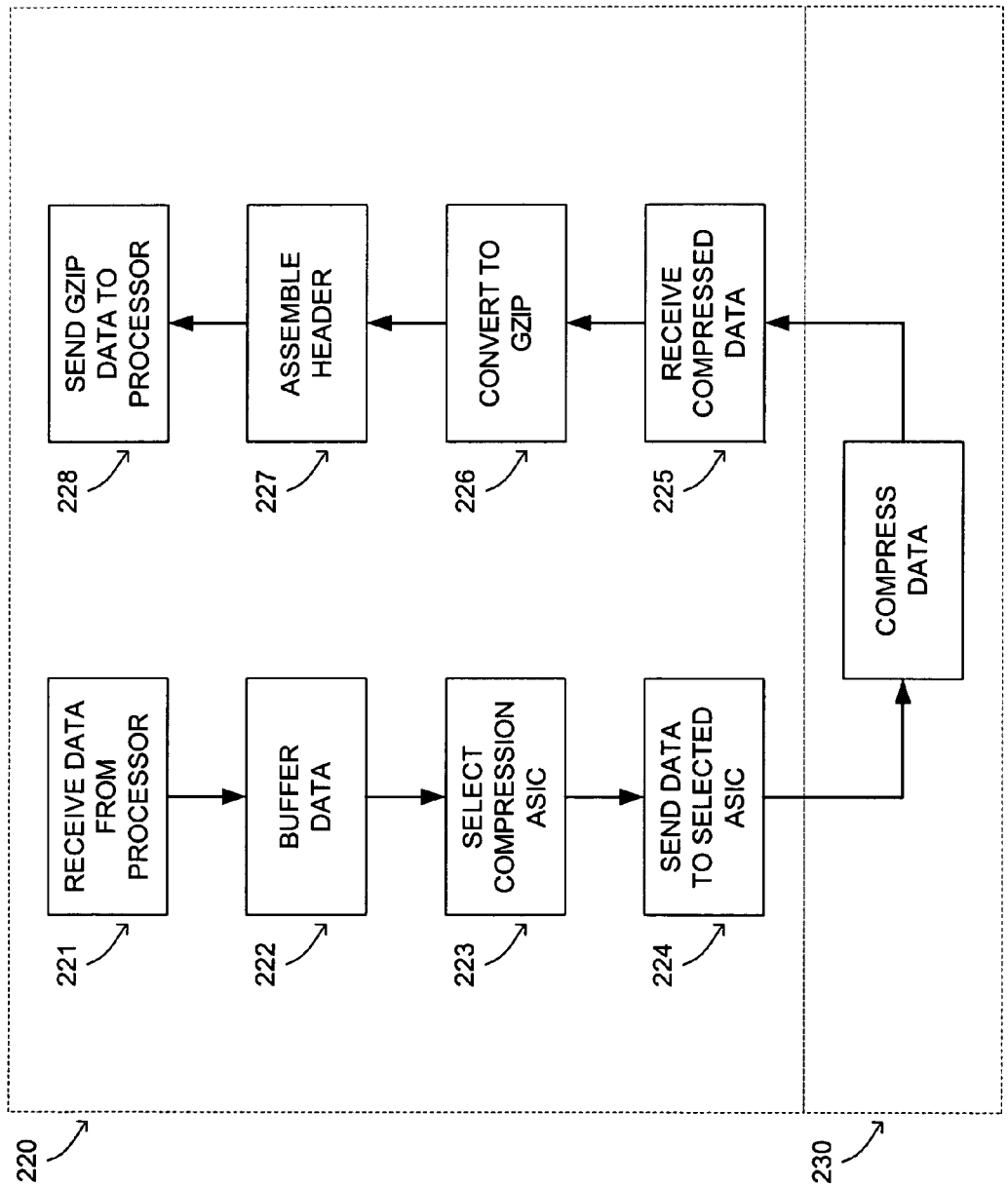
FIGS. 2–4 are illustrations of processes in the example system; arranged according to an example embodiment of the present invention.

FIG. 2 is an illustration of a process for example system 100 that is arranged according to an example embodiment of the present invention. Processing for an example logic block (120) is illustrated by processing steps 220, while processing step 230 illustrates processing for an example compression ASIC (132).

Initially, the flow controller (110) receives ingress traffic. A data stream associated with a flow is sent to the logic block (120) by the flow control processor (112). The compression controller (122) receives the data stream from the flow control processor (112) at block 221, and stores the data stream in memory (124) at block 222. At block 223, the compression controller (122) selects a compression ASIC (e.g., with multiplexer 126). The buffered data stream is sent to the selected compression ASIC (132) at block 224. At block 230, each compression ASIC (132) operates on a respective data stream to provide compressed data such as LZ77 compression. The compressed data is received by logic block 120 (e.g., via compression controller 122) at block 225. Compression controller 122 converts the compressed data into another format such as GZIP. A header is assembled by compression controller 122 at block 124. The header and the converted compressed data are sent to flow controller 110 by logic block 122. The header includes information to identify the data flow that is associated with the compressed data.

Context Switching

When the compression device (e.g., a compression ASIC) switches from one compression stream to another and back, compression ratios can be improved by restoring the compressor to its previous state prior to continuing. By restoring the compressor to a previous state, compression history is extended so that a data stream continues compressing as if the context switch did not occur. The context is the history data that is needed to restore the compressor (SW or HW) to the state it was in at the end of the previous block so that compression continues as if it were a continuous stream. The context data can be sent from the compressor with the compressed data and stored in the context memory in the logic block or flow control processor. However, the flow controller can save this data when it is first sent to the compressor so that it does not need to be sent back saving bandwidth on the interface bus (e.g., the PCI bus). For compression hardware to support context switching there must be enough dedicated memory to store the amount of data required to fill the history buffer for every data stream compressed at one time.

Optionally, a finite number of contexts can be stored in logic block 120 (e.g., via memory 124) to reduce the amount of context data on the interface bus (e.g., a PCI interface bus). Matches can be terminated at the end of the block to simplify context switching. Dynamic codes (e.g., Huffman codes) are calculated for each block. Alternatively, a system processor (e.g., flow control processor 112) can use system memory (e.g., context memory 114) to store context data and then send the context data to the compression hardware in front of the next block of data to be compressed. The system memory is not dedicated to compression, so it is available for other functions such as flow control and load balancing.

In one example, context associated with each data stream is maintained by the flow control processor in the context memory. In other words, the SW maintains the context and passes all relevant information to the compression hardware via header information, where the history data for the hardware compression ASIC is extracted from the header received from the flow controller.

Figure 3:
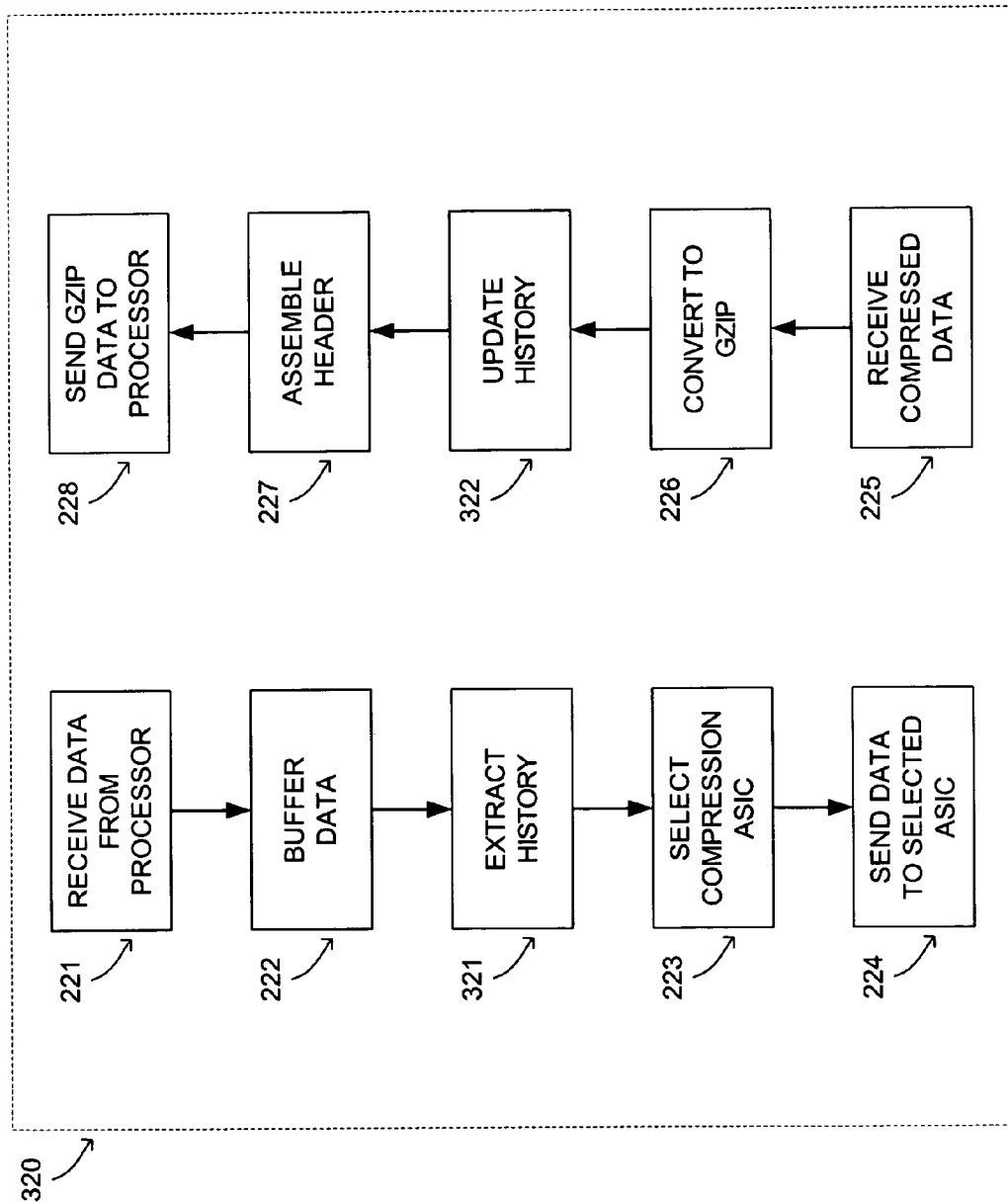

Example header data includes: context location flag, flow ID, context data, first block flag, and byte count. Context location flag identifies whether the context is stored by the logic block or by the flow controller. The logic block utilizes the flow ID to address the context memory, when the context is stored by the logic block. The flow control process uses the flow ID on compressed data from the logic block to identify the associated data stream. Context data is sent by the flow control processor when it is stored by the flow control processor rather than the compression hardware (the logic block), including data to reload the compressor. First block flag identifies the block as the first in a reply so there is no previous context. Byte count is the number of bytes of data in the block, which is used by the compressor to terminate the compression on the last byte. The Header can be simplified when context switching is not used First Example Process Flow with Context Switching FIG. 3 is an illustration of a process for example system 100 that is arranged according to another example embodiment of the present invention. Processing for an example logic block (120) is illustrated by processing steps 320.

For example process 320, the system processor (e.g., flow control processor 112) can use system memory (e.g., context memory 114) to store context data. The context data can be sent to the compression hardware (e.g., to compression controller 122) in front of the next block of data to be compressed. The system memory is not dedicated to compression, so it is available for other functions.

Initially, the flow controller (110) receives ingress traffic. A data stream associated with a flow is sent to the logic block (120) by the flow control processor (112). The compression controller (122) receives data from the flow control processor (112) at block 221, and stores the data in memory (124) at block 222. History information (e.g. a history table) and the data stream are included in the data that is received from the flow controller (120). The history information for the compression algorithm is extracted from the data at block 321. Proceeding to block 223, the compression controller (122) selects a compression ASIC (e.g., with multiplexer 126). The buffered data stream and the history information are sent to the selected compression ASIC (132) at block 224. At block 230 (e.g., see FIG. 2), each compression ASIC (132) operates on a respective data stream to provide compressed data such as LZ77 compression. The compressed data and the history data are received by logic block 120 (e.g., via compression controller 122) at block 225. Compression controller 122 converts the compressed data into another format such as GZIP. Continuing to block 322, the history data associated with the compression algorithm is updated. A header is assembled by compression controller 122 at block 124. The header and the converted compressed data are sent to flow controller 110 by logic block 122. The header includes information to identify the data flow that is associated with the compressed data, and the history data that is associated with the data stream and the particular compression algorithm.

Second Example Process Flow with Context Switching

Figure 4:
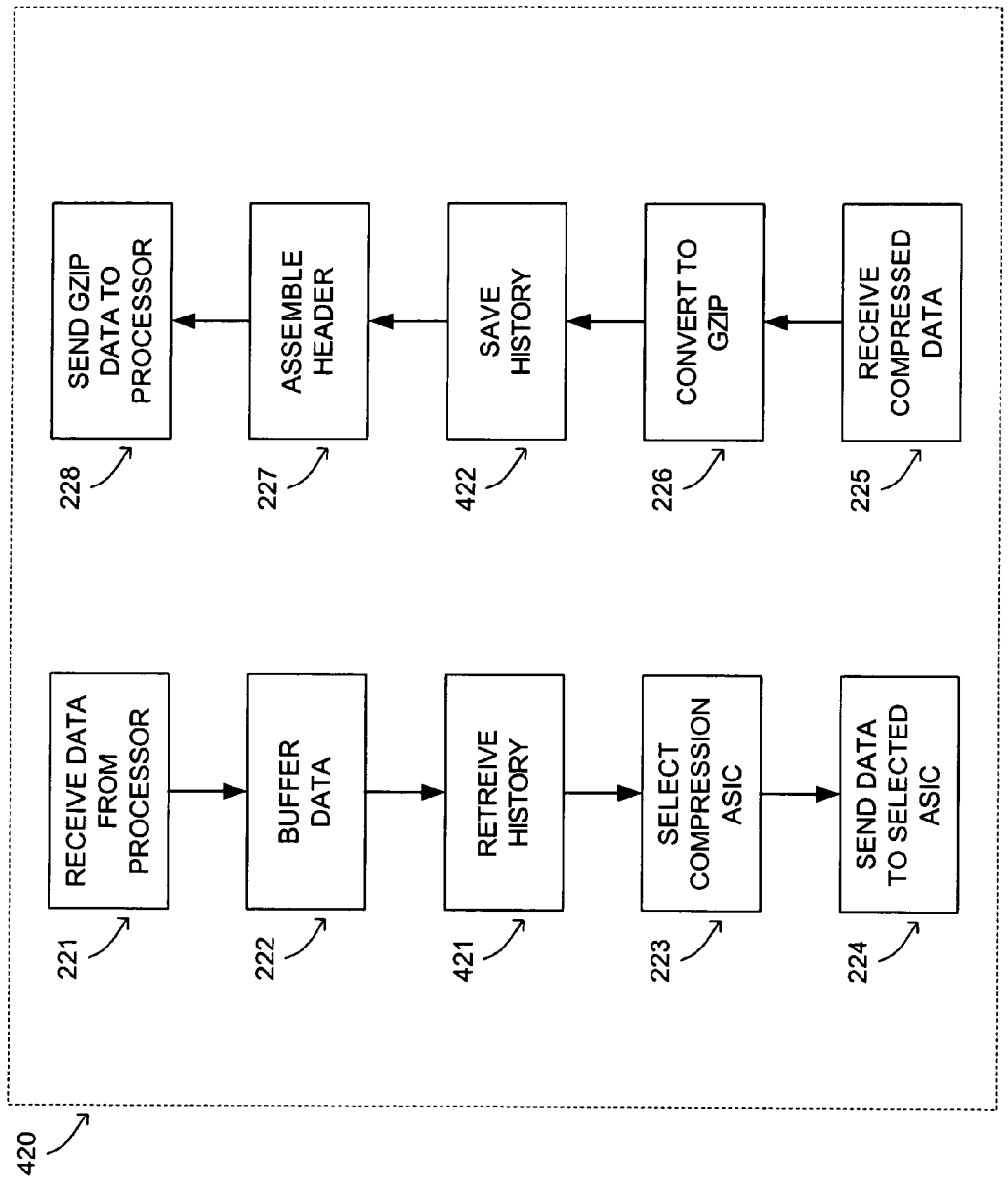

FIG. 4 is an illustration of another process for example system 100 that is arranged according to yet another example embodiment of the present invention. Processing for an example logic block (120) is illustrated by processing steps 420.

For example process 420, logic block 120 uses memory 124 to store context data. The context data can be sent to the compression hardware (e.g., to compression ASIC 132) in front of the next block of data to be compressed.

Initially, the flow controller (110) receives ingress traffic. A data stream associated with a flow is sent to the logic block (120) by the flow control processor (112). The compression controller (122) receives a data stream from the flow control processor (112) at block 221, and stores the data stream in memory (124) at block 222. History information (e.g. a history table) associated with the data stream is retrieved from memory 124 at block 421. Proceeding to block 223, the compression controller (122) selects a compression ASIC (e.g., with multiplexer 126). The buffered data stream and the history information are sent to the selected compression ASIC (132) at block 224. At block 230 (e.g., see FIG. 2), each compression ASIC (132) operates on a respective data stream to provide compressed data such as LZ77 compression. The compressed data and the history data are received by logic block 120 (e.g., via compression controller 122) at block 225. Compression controller 122 converts the compressed data into another format such as GZIP. Continuing to block 422, the history data associated with the compression algorithm is updated and saved in memory 124. A header is assembled by compression controller 122 at block 124. The header and the converted compressed data are sent to flow controller 110 by logic block 122. The header includes information to identify the data flow that is associated with the compressed data.

Selective Hardware Based Compression

The flow controller (110) can be configured to selectively apply hardware compression or software compression based on many factors. For example, software based compression can be applied by the flow controller (110) when the system is not too busy such that enhanced compression ratios can be achieved with a larger history buffer. Hardware based compression can be employed when less system resources are available, such that faster overall data compression rates is achieved. Parameters such as processor idle time and overall memory usage in flow controller 110 can be employed to decide whether hardware or software based compression is to be utilized.

Compression ASICs

Compression ASICs that are not Deflate compliant can be used to build a Deflate compliant compression stream. An example compression ASIC (132) is an adaptive lossless data compression (ALDC) ASIC. ALDC is derivative of the Lempel-Ziv compression algorithms. Several variables affect the compression performance of the ALDC algorithm including data content, history size, and data extent. The ALDC ASIC keeps track of consecutive matching bytes in the data stream. When the longest matching sequence of bytes is determined, a code word is inserted into the compressed data stream that points to the location and the length of the matching sequence. When no matches are found in the data stream, the data is coded as a literal and also inserted into the compressed data stream. Compression is realized when byte sequences are replaced by smaller code words. ALDC ASICs use Huffman codes to encode the match location and length of match for further compression. An example byte window for an ALDC ASICS is 512 bytes in length.

Similar to ALDC, the Deflate compression technique that is employed by GZIP algorithms also uses Huffman codes to encode the match location and length of match. Deflate compression techniques require a byte window that is typically 32K bytes in length. Deflate compression techniques are either not readily available or cost prohibitive.

Deflate and ALDC utilize different Huffman codes and have different byte window sizes for the history buffer. As a result of the differences, compression controller 122 must convert the Huffman codes from ALDC to a GZIP format before forwarding the compressed data back to flow controller 110. In other words, the compressed data stream is converted to a valid deflate data stream by decoding the ALDC (or LZS) Huffman codes and then Huffman encoding using a static or dynamic Deflate Huffman code.

Although the above-described compression ASICs are described with reference to LZ77, GZIP, Deflate, LZS, and ALDC based compression schemes, any other appropriate compression hardware can be employed by the present invention. Principally, the present invention is related to converting a hardware optimized compression ASIC for use with another compression scheme that requires a larger history window. Any appropriate compression scheme can be adapted for use in the present invention.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for compressing data from a data stream comprising:
   a hardware compressor that is arranged to provide compressed data in response to buffered data, wherein the compressed data is encoded according to a first compression format with a first byte window size;
   a logic block that is arranged to: receive data associated with the data stream, store the data as the buffered data, forward the buffered data to the hardware compressor, receive the compressed data from the hardware compressor, convert the compressed data to a second compression format with a second byte window size that is different from the first byte window size, and provide the converted compressed data; and
   a flow controller that is arranged to: monitor system resources associated with the flow controller, algorithmically compress selected data streams with the flow controller when the resources associated with the flow controller are below a minimum criteria, and forward data streams to the logic block for compression when the resources associated with the flow controller exceed the minimum criteria such that compression is off-loaded to the logic block; wherein the minimum criteria comprises at least one of: a processor usage criteria, a memory usage criteria, and a network traffic loading criteria.

2. The apparatus of claim 1, wherein the first compression format is an ALDC format and the second format is a GZIP format.

3. The apparatus of claim 1, wherein the first compression format is an LZS format and the second format is a GZIP format.

4. The apparatus of claim 1, wherein the first byte window size is 512 bytes and the second byte window size is 32 K bytes.

5. The apparatus of claim 1, wherein the first byte window size is 4 K bytes and the second byte window size is 32 K bytes.

6. The apparatus of claim 1, the logic block comprising: a compression controller that is arranged in cooperation with a memory, wherein the compression controller is arranged to control the interaction of the logic block with the hardware compressor.

7. The apparatus of claim 6, wherein context switching is maintained in the memory and the compression controller is configured to provide history information to the hardware compressor based on a context stored in the memory.

8. The apparatus of claim 6, further comprising another hardware compressor that is arranged to provide compressed data in response to another buffered data, wherein the other compressed data is encoded according to the first compression format with the first byte window size; and wherein the logic block further comprises a multiplexer that is arranged to select one of the hardware compressors for operating on the buffered data.

9. The apparatus of claim 1, wherein the flow controller is further arranged to receive requests for data, retrieve the requested data, and provide compressed data in response to the requested data.

10. The apparatus of claim 1, wherein the flow controller includes a flow control processor and a context memory, wherein context switching is maintained by the flow controller in the context memory, and wherein the flow controller is arranged to provide history information to the logic block based on a context stored in the context memory.

11. A method for compressing data associated with a data stream comprising:
   receiving data from a flow controller with a logic block when resources associated with the flow controller exceed a minimum criteria, wherein the minimum criteria comprises at least one of: a processor usage associated with the flow controller, a memory usage associated with the flow controller, and a network traffic loading associated with the flow controller;
   storing the received data as buffered data;
   selecting a hardware compressor for processing the buffered data;
   sending the buffered data from the logic block to the selected hardware compressor;
   compressing the buffered data according to a first compression format with the selected hardware compressor, wherein the first compression format has a first history window size;
   retrieving the compressed data from the selected hardware compressor with the logic block;
   converting the compressed data to a second compression format with the logic block, wherein the second compression format has a second history window size;
   assembling a header with the logic block, wherein the header associates the converted compressed data with the data from the flow controller; and
   sending the header and the converted compressed data to the flow controller.

12. The method of claim 11, wherein the first history window size is different from the second history window size.

13. The method of claim 11, wherein the first compression format is at least one of an ALDC format, an LZ77 format, and an LZS format.

14. The method of claim 11, wherein the second compression format is a GZIP deflate format.

15. The method of claim 11, further comprising: extracting history information from the data received by the logic block from the flow controller, sending the history information to the selected hardware compressor, updating the history information in response to the first compressed data with the logic block, and sending the updated history information to the flow controller.

16. The method of claim 15, wherein the history information is extracted from another header that is provided by the flow controller to the logic block, wherein the other header includes at least one of a context location flag, a reply ID, a context data, a first block flag, and a byte count.

17. The method of claim 11, further comprising: retrieving history information that is associated with the data stream from a memory that is associated with the logic block, sending the history information to the selected hardware compressor, updating the history information in response to the first compressed data with the logic block,.

18. The method of claim 17, further comprising: assembling another header with the logic block such that the history information is associated with at least one of a context location flag, a reply ID, a context data, a first block flag, and a byte count, wherein sending the buffered data includes sending the other header to the selected hardware compressor.

19. The method of claim 11, further comprising: compressing another buffered data according to the first compression format with another selected hardware compressor, wherein the hardware compressor and the other hardware compressor are operable in parallel for enhanced compression speeds.

20. A system for compressing data associated with a data stream, comprising:
  a first hardware compressor that is arranged to compress data according to a first compression format;
  a second hardware compressor that is arranged to compress data according to the first compression format;
  a flow controller that is arranged to monitor system resources associated with the flow controller, wherein the flow controller is also arranged to offload compression based upon the monitored system resource, wherein the monitored system resources comprise at least one of: a processor usage in the flow controller, a memory usage in the flow controller, and a network traffic loading effect in the flow controller; and
  a logic block that includes:
  a first means for receiving that is arranged to receive data from the flow controller when the monitored process loading exceeds a processing criteria associated with the flow controller;
  a means for storing the received data as buffered data;
  a means for selecting one of the first and second hardware compressors for processing the buffered data;
  a first means for sending that is arranged to send buffered data to the selected hardware compressor;
  a second means for receiving that is arranged to receive compressed data from the selected hardware compressor, wherein the compressed data is arranged according to a first compression format;
  a means for converting the compressed data to a second compression format that is different from the first compression format; and
  a second means for sending that is arranged to send converted compressed data to the flow controller such that the converted compressed data is associated with the data received from the flow controller.

21. The system of claim 20, wherein the flow controller is arranged to: compress data according to the second compression format when sufficient resources in the flow controller are available, and send data to the logic block when insufficient resources in the flow controller are available.

22. A method for compressing data associated with a flow, comprising:
  receiving the data with a flow controller;
  evaluating system resources associated with the flow controller;
  selecting a software based compression method when sufficient system resources are available in the flow controller;
  selecting a hardware based compression method when insufficient system resources are available in the flow controller; and
  compressing the data according to the selected compression method based on the evaluated system resources.

23. The method of claim 22, wherein evaluating system resources associated with the flow controller comprises at least one of: evaluating processor usage associated with the flow controller, evaluating processor idle time associated with the flow controller, evaluating memory usage associated with the flow controller, evaluating traffic loading associated with the flow controller, and evaluating history buffer sizes associated with the flow controller.

24. The method of claim 22, further comprising: maintaining context information with the flow controller, wherein the context information is associated with each flow.

25. The method of claim 22, farther comprising: maintaining context information with the flow controller, wherein the context information is associated with each flow, and passing the context information to a logic block when the hardware based compression method is selected.

26. The method of claim 22, wherein the hardware compression method comprises:
  receiving data from the flow controller when insufficient system resources are available in the flow controller for software based compression;
  storing the received data as buffered data;
  selecting a hardware compressor for processing the buffered data;
  compressing the buffered data according to a compression format with the selected hardware compressor;
  converting the compressed data to another compression format; and
  sending the converted compressed data to the flow controller.

27. The method of claim 26, further comprising: compressing another buffered data according to the compression format with another selected hardware compressor, wherein the hardware compressor and the other hardware compressor are operable in parallel for enhanced compression speeds.

28. The method of claim 26, wherein the compression format and the other compression format are different from one another.

29. An apparatus for compressing a data stream associated with a flow, comprising:
  a hardware compressor that is arranged to provide compressed data in response to the data stream;
  a software compressor that is arranged to provide compressed data in response to the data stream; and
  a flow controller that is arranged to: evaluate system resources associated with the flow controller, select the software compressor for compression of the data stream when sufficient system resources are available in the flow controller, and select the hardware compressor for compression when insufficient system resources are available in the flow controller.

30. The apparatus of claim 29, wherein the flow controller is arranged to evaluate system resources by evaluating at least one of: processor usage associated with the flow controller, and idle time associated with the flow controller.

31. The apparatus of claim 29, wherein the flow controller is arranged to evaluate system resources by evaluating memory usage associated with the flow controller.

32. The apparatus of claim 29, wherein the flow controller is arranged to evaluate system resources by evaluating traffic loading associated with the flow controller.

33. The apparatus of claim 29, wherein the flow controller is arranged to evaluate system resources by evaluating history buffer sizes associated with the flow controller.

34. The apparatus of claim 29, wherein the flow controller is further arranged to maintain context information that is associated with each flow.

35. The apparatus of claim 34, further comprising: a logic block that is arranged to receive the context information from the flow controller when the hardware compressor is selected by the flow controller for compression.

36. The apparatus of claim 29, further comprising: a logic block that is arranged in cooperation with the hardware compressor to: receive data from the flow controller when insufficient system resources are available in the flow, store the received data as buffered data; forward the buffered data to the hardware compressor for compression, receive compressed data from the hardware compressor, convert the compressed data received from the hardware compressor to another compression format with the logic block, and send the converted compressed data to the flow controller.

37. The apparatus of claim 36, further comprising: another hardware compressor that is arranged to operate in parallel with the hardware compressor for enhanced compression speeds.

38. The apparatus of claim 36, wherein a compression format of the hardware compressor has a first byte window size, and wherein the other compression format has a second byte windows size that is different from the first byte window size.

* * * * *